United States Patent
Smith

(10) Patent No.: US 8,242,354 B2
(45) Date of Patent: *Aug. 14, 2012

(54) BACKSIDE CONTACT SOLAR CELL WITH FORMED POLYSILICON DOPED REGIONS

(75) Inventor: David D. Smith, Campbell, CA (US)

(73) Assignee: SunPower Corporation, San Jose, CA (US)

( * ) Notice: Subject to any disclaimer, the term of this patent is extended or adjusted under 35 U.S.C. 154(b) by 292 days.

This patent is subject to a terminal disclaimer.

(21) Appl. No.: 12/626,483

(22) Filed: Nov. 25, 2009

(65) Prior Publication Data

US 2010/0139764 A1   Jun. 10, 2010

Related U.S. Application Data

(60) Provisional application No. 61/119,955, filed on Dec. 4, 2008.

(51) Int. Cl.
*H01L 31/00* (2006.01)

(52) U.S. Cl. .................. 136/258; 136/261; 136/265

(58) Field of Classification Search .................. 136/252, 136/258, 261, 265
See application file for complete search history.

(56) References Cited

U.S. PATENT DOCUMENTS

| | | |
|---|---|---|
| 3,961,997 A | 6/1976 | Chu |
| 4,427,839 A | 1/1984 | Hall |
| 4,665,277 A | 5/1987 | Sah et al. |
| 4,927,770 A | 5/1990 | Swanson |
| 5,030,295 A | 7/1991 | Swanson et al. |
| 5,053,083 A | 10/1991 | Sinton |
| 5,057,439 A | 10/1991 | Swanson et al. |
| 5,164,019 A | 11/1992 | Sinton |
| 5,217,539 A | 6/1993 | Fraas et al. |
| 5,266,125 A | 11/1993 | Rand et al. |
| 5,360,990 A | 11/1994 | Swanson |
| 5,369,291 A | 11/1994 | Swanson |
| 5,641,362 A | 6/1997 | Meier |
| 5,918,140 A | 6/1999 | Wickboldt et al. |
| 6,262,359 B1 | 7/2001 | Meier et al. |
| 6,274,402 B1 | 8/2001 | Verlinden et al. |
| 6,313,395 B1 | 11/2001 | Crane et al. |
| 6,333,457 B1 | 12/2001 | Mulligan et al. |
| 6,337,283 B1 | 1/2002 | Verlinden et al. |
| 6,387,726 B1 | 5/2002 | Verlinden et al. |
| 6,423,568 B1 | 7/2002 | Verlinden et al. |
| 6,524,880 B2 | 2/2003 | Moon et al. |
| 6,692,985 B2 | 2/2004 | Huang et al. |
| 6,998,288 B1 | 2/2006 | Smith et al. |

(Continued)

OTHER PUBLICATIONS

Smedt et al "Ultra-Thin Oxide Growth on Silicon Using Ozonated Solutions", Solid State Phenomena, vols. 65-66 pp. 81-82 (1999).*

(Continued)

*Primary Examiner* — Basia Ridley
*Assistant Examiner* — Alexander Kollias
(74) *Attorney, Agent, or Firm* — Okamoto & Benedicto LLP

(57) ABSTRACT

A solar cell includes abutting P-type and N-type doped regions in a contiguous portion of a polysilicon layer. The polysilicon layer may be formed on a thin dielectric layer, which is formed on a backside of a solar cell substrate (e.g., silicon wafer). The polysilicon layer has a relatively large average grain size to reduce or eliminate recombination in a space charge region between the P-type and N-type doped regions, thereby increasing efficiency.

7 Claims, 5 Drawing Sheets

U.S. PATENT DOCUMENTS

| | | | | |
|---|---|---|---|---|
| 7,135,350 | B1 | 11/2006 | Smith et al. | |
| 7,468,485 | B1* | 12/2008 | Swanson | 136/243 |
| 7,633,006 | B1* | 12/2009 | Swanson | 136/258 |
| 2002/0153039 | A1* | 10/2002 | Moon et al. | 136/256 |
| 2003/0134469 | A1 | 7/2003 | Horzel et al. | |
| 2004/0200520 | A1 | 10/2004 | Mulligan et al. | |
| 2004/0231590 | A1* | 11/2004 | Ovshinsky | 118/718 |
| 2005/0268963 | A1 | 12/2005 | Jordan et al. | |
| 2006/0130891 | A1 | 6/2006 | Carlson | |
| 2006/0157103 | A1 | 7/2006 | Sheats et al. | |
| 2007/0082206 | A1 | 4/2007 | Hartig | |
| 2007/0151598 | A1 | 7/2007 | De Ceuster et al. | |
| 2009/0205712 | A1 | 8/2009 | Cousins | |

OTHER PUBLICATIONS

Kohler et al "Large-grained polycrystalline silicon on glass by copper vapor laser annealing", Thin Solid Films, vol. 337, Issues 1-2, Jan. 11, 1999 pp. 129-132.*

W.P. Mulligan, et al. "A Flat-Plate Concentrator: Micro-Concentrator Design Overview", 2000, 3 sheets, Proceedings of the 28th IEEE PVSC.

K. R. McIntosh, et al. "The Choice of Silicon Wafer for the Production of Low-Cost Rear-Contact Solar Cells", May 2003, 4 sheets, Sunpower Corporation, Sunnyvale, CA.

P.J. Verlinden, et al. "Will We have a 20%-Efficient(PTC) Photovoltaic System?", 2001, 6 sheets, Proceedings of the 17th Europe Photovoltaic Solar Energy Conference.

William P. Mulligan, et al. "Development of Chip-Size Silicon Solar Cells", 2000, 6 sheets, Proceedings of the 28th IEEE PVSC.

Akira Terao, et al. "A Mirror-Less Design for Micro-Concentrator Modules", 2000, 4 sheets, Proceedings of the 28th IEEE PVSC.

P.J. Verlinden, et al. "Backside-Contact Silicon Solar Cells with Improved Efficiency for the '96 World Solar Challenge", 1997, 5 sheets, Proceedings of the 15th EPSEC.

P.J. Verlinden, et al. "One-Year Comparison of a Concentrator Module with Silicon Point-Contact Solar Cell to a Fixed Flat Plate Module in Northern California", 2000, 4 sheet, Proceedings of the 16th EPSEC.

Richard M. Swanson, "The Promise of Concentrators", 2000, Prog. Photovolt. Res. Appl. 8, pp. 93-111 (2000), Sunpower Corporation, Sunnyvale, CA.

Ronald A. Sinton, et al. "Simplified Backside-Contact Solar Cells", Feb. 1990, pp. 348-352, IEEE Transactions on Electron Devices, vol. 37. No. 2.

Ronald A. Sinton, "Device Physics and Characterization of Silicon Point-Contact Solar Cells", Feb. 1997, pp. 1-154, Stanford Electronics Laboratories, Stanford University, CA.

Richard Roland King, "Studies of Oxide-Passivated Emitters in Silicon and Applications to Solar Cells", Aug. 1990, pp. 1-200, (Thesis) Electrical Engineering Department of Stanford University, CA.

Eric Fogarassy, et al. "Long-Pulse Excimer Laser Crystallization and Doping for the Fabrication of High Performance Polysilicon TFTs", Jan. 2006, pp. S40-S46, Journal of the Korean Physical Society, vol. 48.

Ted Kamins, "Polycrystalline Silicon for Integrated Circuit Applications" third printing 1994, pp. 198-199, Kluwer Academic Publishers, Norwell, Massachusetts.

PCT International Search Report for Application No. PCT/US09/66046 mailed on Jan. 21, 2010 (2 sheets).

* cited by examiner

BACKSIDE CONTACT SOLAR CELL WITH FORMED POLYSILICON DOPED REGIONS

CROSS-REFERENCE TO RELATED APPLICATION

This application claims the benefit of U.S. Provisional Application Ser.No. 61/119,955, filed on Dec. 4, 2008, which is incorporated herein by reference in its entirety.

STATEMENT REGARDING FEDERALLY SPONSORED RESEARCH OR DEVELOPMENT

The invention described herein was made with Governmental support under contract number DE-FC36-07GO17043 awarded by the United States Department of Energy. The Government may have certain rights in the invention.

BACKGROUND OF THE INVENTION

1. Field of the Invention

The present invention relates generally to solar cells, and more particularly but not exclusively to solar cell fabrication processes and structures.

2. Description of the Background Art

Solar cells are well known devices for converting solar radiation to electrical energy. They may be fabricated on a semiconductor wafer using semiconductor processing technology. A solar cell includes P-type and N-type doped regions. Solar radiation impinging on the solar cell creates electrons and holes that migrate to the doped regions, thereby creating voltage differentials between the doped regions. In a backside contact solar cell, both the doped regions and the interdigitated metal contact fingers coupled to them are on the backside of the solar cell. The contact fingers allow an external electrical circuit to be coupled to and be powered by the solar cell.

Efficiency is an important characteristic of a solar cell as it is directly related to the solar cell's capability to generate power. Accordingly, techniques for increasing the efficiency of solar cells are generally desirable. The present invention allows for increased solar cell efficiency by providing processes for fabricating novel solar cell structures.

SUMMARY

A solar cell includes abutting P-type and N-type doped regions in a contiguous portion of a polysilicon layer. The polysilicon layer may be formed on a thin dielectric layer, which is formed on a backside of a solar cell substrate (e.g., silicon wafer). The polysilicon layer has a relatively large average grain size to reduce or eliminate recombination in a space charge region between the P-type and N-type doped regions, thereby increasing efficiency.

These and other features of the present invention will be readily apparent to persons of ordinary skill in the art upon reading the entirety of this disclosure, which includes the accompanying drawings and claims.

DESCRIPTION OF THE DRAWINGS

FIGS. 1-12 show sectional views schematically illustrating the fabrication of a solar cell in accordance with an embodiment of the present invention.

Figure 4:
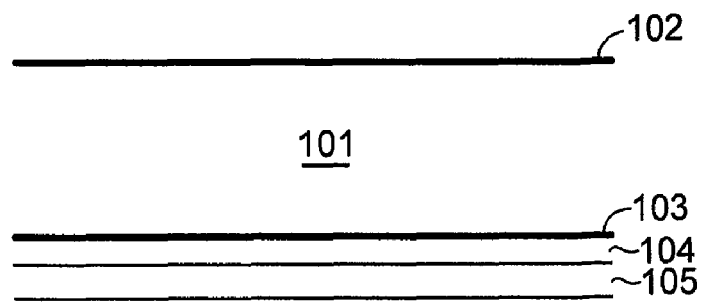

The use of the same reference label in different drawings indicates the same or like components. The figures are not drawn to scale.

DETAILED DESCRIPTION

In the present disclosure, numerous specific details are provided, such as examples of materials, process parameters, process steps, and structures, to provide a thorough understanding of embodiments of the invention. Persons of ordinary skill in the art will recognize, however, that the invention can be practiced without one or more of the specific details. In other instances, well-known details are not shown or described to avoid obscuring aspects of the invention.

In solar cells with P-type and N-type doped regions in the substrate, the P-type and N-type doped regions may be formed with separate or abutting perimeters. The inventor discovered, however, that this is not true with polysilicon doped regions because recombination in the space charge region where the polysilicon doped regions touch is very high due to the lifetime of charge carriers in the polysilicon being very low. That is, the inventor discovered that touching polysilicon doped regions can adversely affect efficiency. One way of eliminating or reducing this loss mechanism is to physically separate polysilicon P-Type and N-type doped regions with a trench as described in U.S. Provisional Application No. 61/060,921, entitled "Trench Process and Structure for Backside Contact Solar Cells with Polysilicon Diffusion Regions," filed by the inventor on Jun. 12, 2008. Another way, which does not necessarily involved forming a trench between the doped regions, is disclosed herein. As will be more apparent below, embodiments of the present invention may also be used in conjunction with a trench depending on the application.

FIGS. 1-12 show sectional views schematically illustrating the fabrication of a solar cell in accordance with an embodiment of the present invention. FIGS. 1-12 show sequential processing of a wafer to a solar cell. It is to be understood, however, that some of the process steps may be performed out of sequence or not at all depending on implementation.

Figures 1, 2, 3:
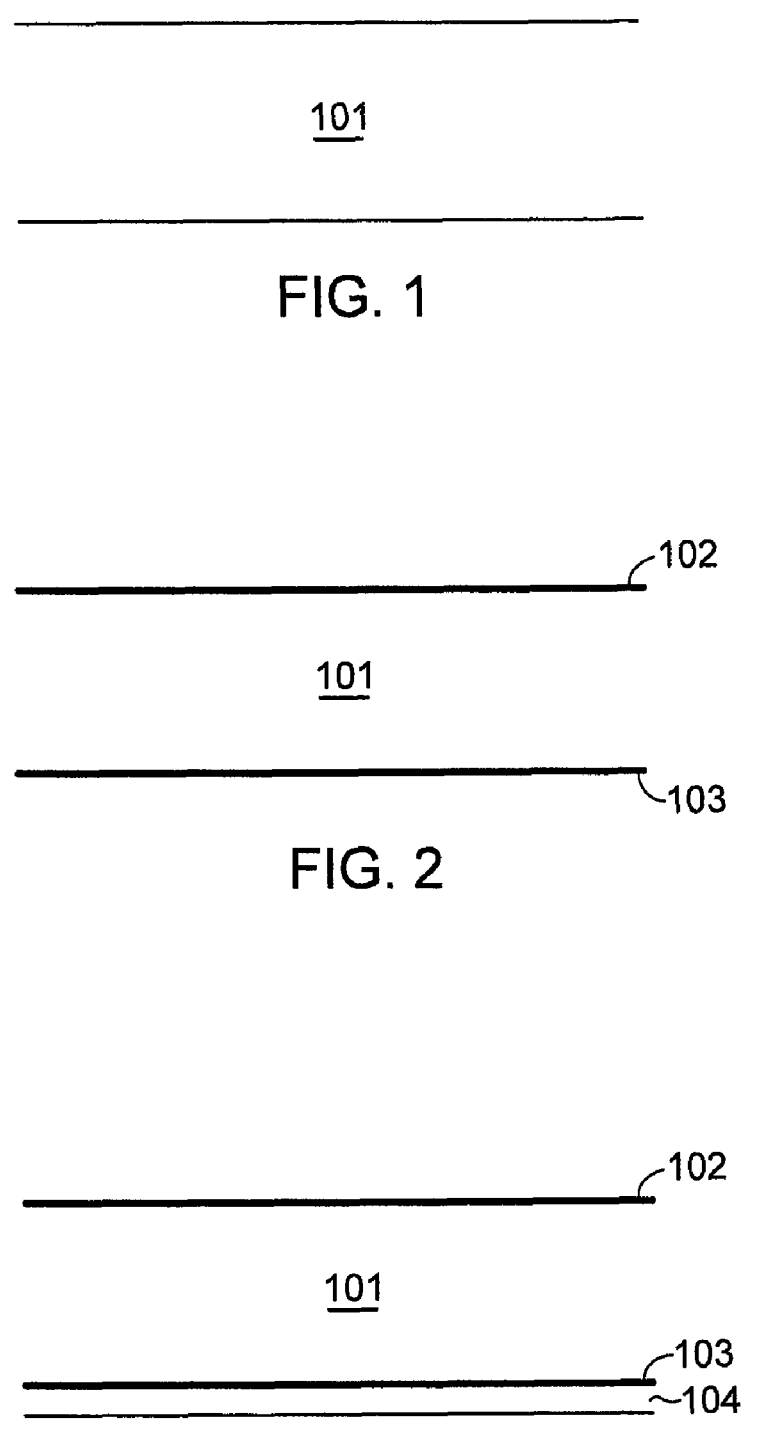

A substrate 101 is prepared for processing into a solar cell by undergoing a damage etch step (FIG. 1). The substrate 101 comprises an N-type silicon wafer in this example, and is typically received with damaged surfaces due to the sawing process used by the wafer vendor to slice the substrate 101 from its ingot. The substrate 101 may be about 100 to 200 microns thick as received from the wafer vendor. In one embodiment, the damage etch step involves removal of about 10 to 20 μm from each side of the substrate 101 using a wet etch process comprising potassium hydroxide. The damage etch step may also include cleaning of the substrate 101 to remove metal contamination.

Thin dielectric layers 102 and 103 are formed on the front and back surfaces, respectively, of the substrate 101 (FIG. 2). The thin dielectric layers may comprise silicon dioxide thermally grown to a thickness less than or equal to 40 Angstroms (e.g., between 5 to 40 Angstroms, preferably 20 Angstroms) on the surfaces of the substrate 101. The front surface of the substrate 101 and materials formed thereon are referred to as being on the front side of the solar cell because they face the sun to receive solar radiation during normal operation. Similarly, the back surface of the substrate 101 and materials formed thereon are referred to as being on the backside of the solar cell, which is opposite the front side.

A polysilicon layer 104 is formed on the thin dielectric layer 103 on the backside of the solar cell (FIG. 3). The polysilicon layer 104, which is undoped at this stage of fabrication, may be formed to a thickness of about 1000 to 2000 Angstroms by LPCVD.

A doped silicon dioxide layer 105 is formed on the polysilicon layer 104 (FIG. 4). The doped silicon dioxide layer 105 serves as a dopant source for a subsequently formed doped region in the polysilicon layer 104, which is a P-type doped region 120 in this example (see FIG. 7). The doped silicon dioxide layer 105 may thus be doped with a P-type dopant, such as boron. In one embodiment, the doped silicon dioxide layer 105 comprises BSG (boron-silicate-glass) formed to a thickness of about 1000 Angstroms by atmospheric pressure chemical vapor deposition (APCVD).

Figure 5:
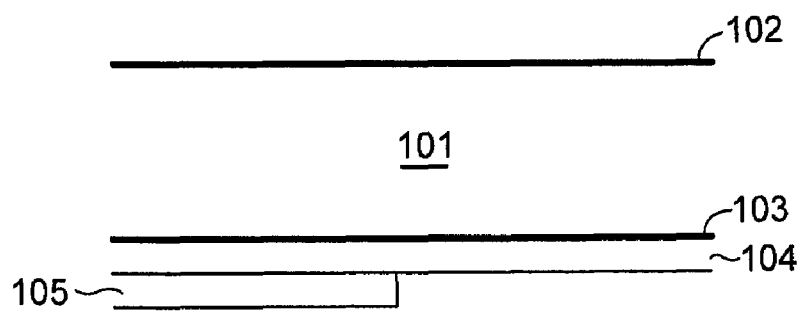

The doped silicon dioxide layer 105 is patterned to remain over an area of the polysilicon layer 104 where the P-type doped region 120 is to be formed (FIG. 5).

Figure 6:
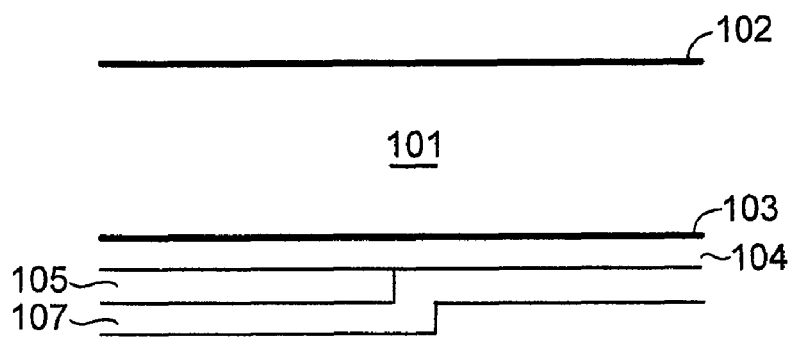

A doped silicon dioxide layer 107 is formed on the doped silicon dioxide 105 and the polysilicon layer 104 (FIG. 6). The doped silicon dioxide 107 serves as a dopant source for a subsequently formed doped region in the polysilicon layer 104, which is an N-type doped region 121 in this example (see FIG. 7). The doped silicon dioxide 107 may thus be doped with an N-type dopant, such as phosphorus. In one embodiment, the doped silicon dioxide 107 comprises PSG (phosphosilicate glass) formed to a thickness of about 2000 Angstroms by APCVD.

Figure 7:
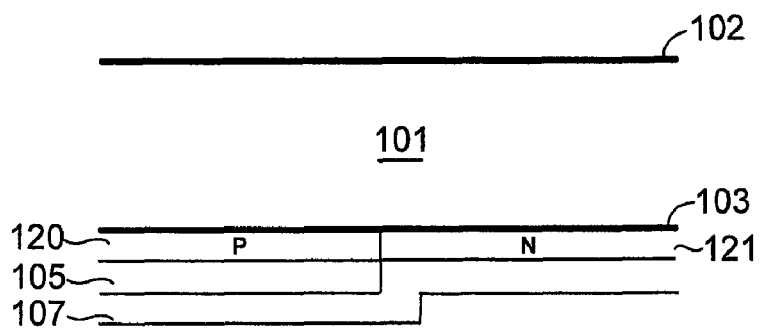

A thermal drive-in step diffuses dopants from the doped silicon dioxide layer 105 and doped silicon dioxide layer 104 to the underlying polysilicon layer 104 to form the abutting P-type doped region 120 and the N-type doped region 121, respectively, in a contiguous portion of the polysilicon layer 104 (FIG. 7). The polysilicon layer 104 has been relabeled as P-type doped region 120 and N-type doped region 121 to reflect the doped state of the polysilicon layer 104 at this stage of the process. As can be appreciated, a typical solar cell has several doped regions but only two are shown here for clarity of illustration.

The P-type doped region 120 and the N-type doped region 121 serve as formed diffusion regions on the backside of the solar cell. The P-type doped region 120 and the N-type doped region 121 are in a contiguous portion of the polysilicon layer 104 and physically abut.

In one embodiment, the thermal drive-in step is performed such that the polysilicon layer 104 is recrystallized to have a larger grain size, preferably an average grain size of at least 1 micron, more preferably at least 5 micron, and most preferably at least 10 micron. The larger grain size of the polysilicon layer 104 increases minority carrier lifetime in the polysilicon layer 104, thereby decreasing recombination in the space charge region and improving efficiency.

The thermal drive-in step is also preferably performed such that the resulting P-type doped region 120 and N-type doped region 121 are heavily doped. The preferred drive conditions give a heavily doped, e.g., greater than $1e^{20}cm^{-3}$, polysilicon layer 104 that is uniform throughout the thickness of the film and has very little doping under the polysilicon, e.g., equal to or less than $1e^{18}cm^{-3}$.

The polysilicon layer 104 may be heavily doped and recrystallized to have larger grain size by vertical localized heating of the polysilicon layer 104 without substantially increasing surface recombination on the thin dielectric layer 103. This vertical localized (as opposed to blanket) heating may be performed by, for example, using excimer laser annealing. An excimer laser annealing tool, such as those available from Coherent, Inc., may be used to scan the surface of the doped silicon dioxide layer 107 of FIG. 6. The excimer laser annealing process drives dopants from the dopant sources to the polysilicon layer 104, thereby forming the doped regions 120 and 121.

Figure 8:
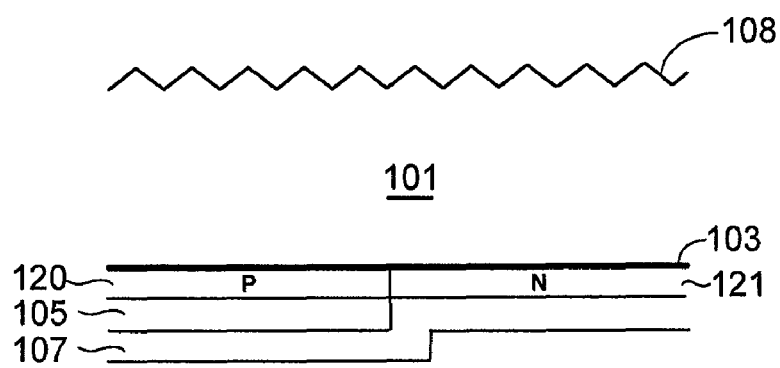

The front side surface of the substrate 101 is randomly textured to form a textured surface 108 (FIG. 8). In one embodiment, the front side surface of the substrate 101 is textured with random pyramids using a wet etch process comprising potassium hydroxide and isopropyl alcohol. The textured surface 108 helps increase solar radiation collection.

Figure 9:
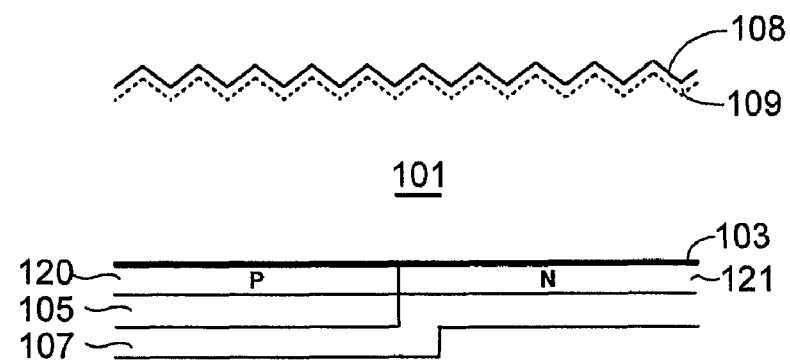

The front side surface of the substrate 101 is doped to form an N-type doped region 109 on the front side of the solar cell (FIG. 9). The N-type doped region 109 may be formed by introduction of an N-type dopant, such as phosphorus, in a diffusion furnace during a diffusion step.

Figure 10:
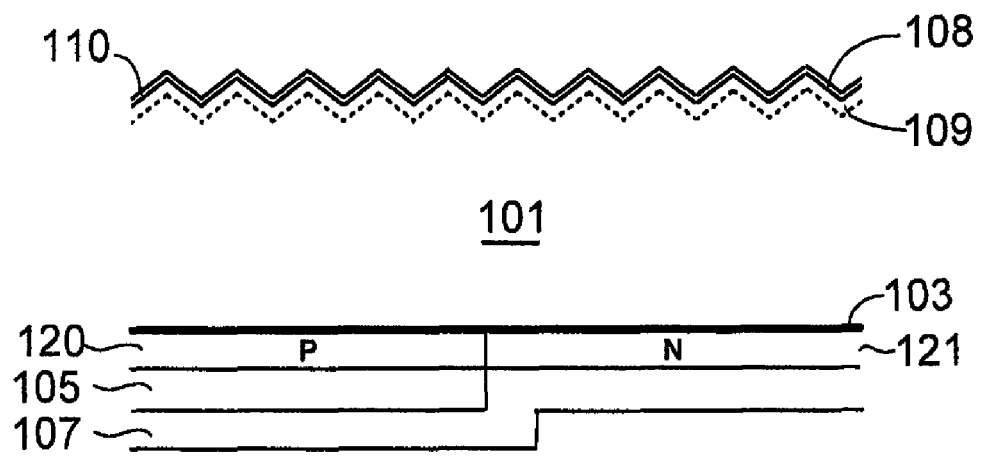

A passivating oxide 110 is formed on the textured surface 108 (FIG. 10). The passivating oxide 110 may comprise silicon dioxide thermally grown to a thickness of about 10 to 250 Angstroms on the textured front side surface of the substrate 101.

Figure 11:
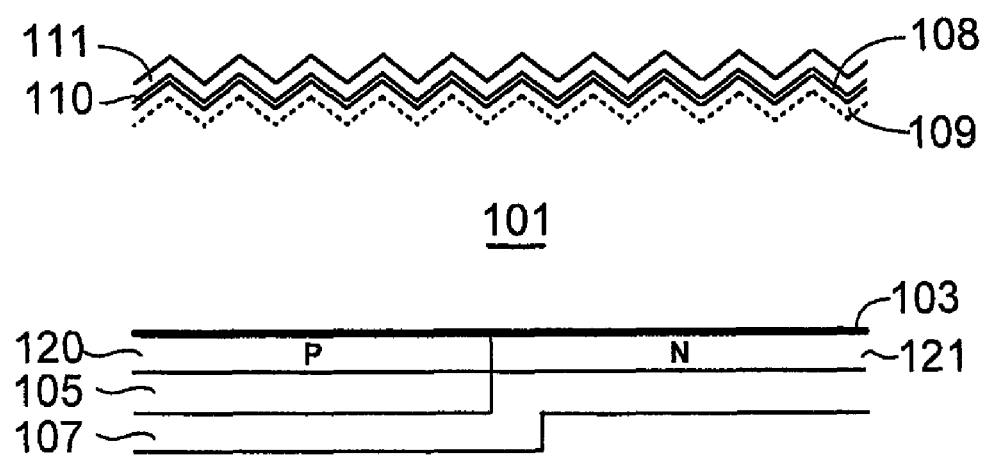

An anti-reflection coating 111 is formed on the textured surface 108 (FIG. 11). The anti-reflection coating 111 may comprise silicon nitride layer formed to a thickness of about 450 Angstroms by PECVD, for example.

Figure 12:
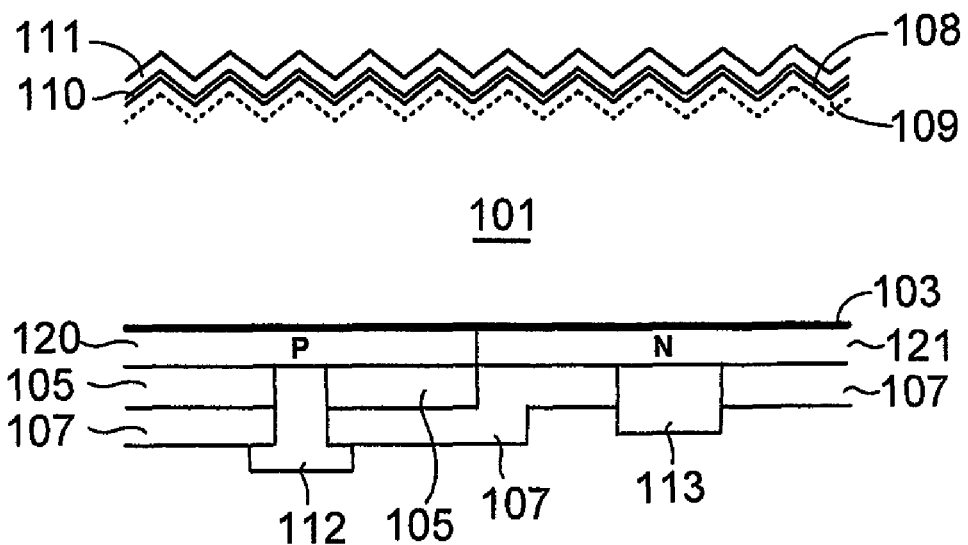

The fabrication of the solar cell is completed by forming metal contacts 112 and 113 (FIG. 12). In this example, the metal contact 112 electrically connects to the P-type doped region 120 through the layers 107 and 105, while the metal contact 113 electrically connects to the N-type doped region 121 through the layer 107. The metal contacts 112 and 113 allow an external electrical circuit to be coupled to and be powered by the solar cell.

The metal contacts 112 and 113 may comprise single or multi-layer metal contacts. For example, each of the metal contacts 112 and 113 may comprise a stack of materials comprising aluminum formed on a silicon dioxide layer (e.g., layer 105 or 107) towards a doped region (e.g., doped region 120 or 121), a diffusion barrier comprising titanium-tungsten formed on the aluminum, and a seed layer comprising copper formed on the diffusion barrier. Interdigitated metal fingers may be formed to electrically connect to the metal contact by electroplating copper on the copper seed layer, for example. Aluminum in the metal contacts 112 and 113 advantageously form an infrared reflector with underlying silicon dioxide, increasing efficiency.

Compared to a solar cell with a trench separating the doped regions, embodiments of the present invention advantageously have fewer process steps. More specifically, embodiments of the present invention do not necessarily require fabrication of a trench that separates doped regions. This while preserving the reverse bias breakdown electrical characteristics of solar cells having trench-separated doped regions. Embodiments of the present invention also potentially allow for lower reverse bias breakdown voltage.

As can be appreciated from the foregoing, embodiments of the present invention may also be used in conjunction with trench-separation. This may be done in applications where it is not feasible to recrystallize the grains of the polysilicon layer 104 large enough to prevent or minimize recombination in the space charge region between doped regions. This alternative embodiment is discussed with reference to FIG. 13.

Figure 13:
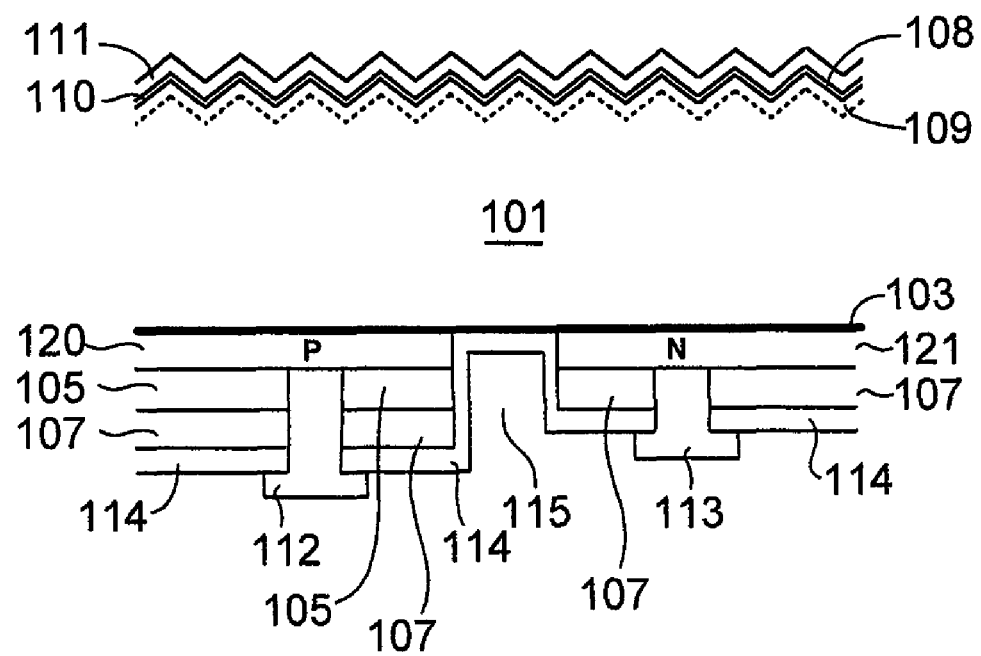
FIG. 13 schematically shows a cross-section of a solar cell in accordance with another embodiment of the present invention.

FIG. 13 schematically shows a cross-section of a solar cell in accordance with another embodiment of the present invention. In the example of FIG. 13, the solar cell includes a trench 115 physically separating the P-type doped region 120 from the N-type doped region 121.

A dielectric in the form of a silicon nitride layer 114 is formed in the trench 115. In the example of FIG. 13, the silicon nitride layer 114 is also formed over the layer 107. The silicon nitride layer 114 preferably has a relatively large positive fixed charge density to place the silicon surface under the trench 115 in accumulation and to provide good surface passivation. The positive fixed charge density on the silicon nitride layer 114 may naturally occur as part of a PECVD process. For example, the silicon nitride layer 114 may be formed to a thickness of about 400 Angstroms by PECVD. The silicon nitride 114 preferably has a planar (e.g., as deposited) surface. The trench 115 and the silicon nitride layer 114 may be formed after the excimer laser annealing step that thermally drives in dopants to the silicon dioxide layer 104, as previously discussed with reference to FIG. 7.

Improved solar cell fabrication processes and structures have been disclosed. While specific embodiments of the present invention have been provided, it is to be understood that these embodiments are for illustration purposes and not limiting. Many additional embodiments will be apparent to persons of ordinary skill in the art reading this disclosure.

What is claimed is:

1. A solar cell comprising:
   a silicon substrate;
   a dielectric formed over a backside of the silicon substrate, the backside being opposite a front side that faces the sun during normal operation; and
   a polysilicon layer formed over the dielectric, the polysilicon layer having a P-type doped region and an N-type doped region formed in a contiguous portion of the polysilicon layer, the polysilicon layer having an average grain size of at least 1 micron at an interface between the P-type doped region and the N-type doped region.

2. The solar cell of claim 1 wherein the dielectric comprises silicon dioxide.

3. The solar cell of claim 1 wherein the dielectric comprises silicon dioxide formed to a thickness less than 40 Angstroms.

4. The solar cell of claim 1 further comprising:
   metal contacts electrically coupling the P-type doped region and the N-type doped region to an external electrical circuit powered by the solar cell.

5. The solar cell of claim 1 wherein the silicon substrate comprises an N-type silicon wafer.

6. The solar cell of claim 1 wherein the silicon substrate has a textured front side surface.

7. The solar cell of claim 1 further comprising an anti-reflective coating over the front side of the silicon substrate.

* * * * *